United States Patent
Oyama et al.

(10) Patent No.: US 8,266,787 B2
(45) Date of Patent: Sep. 18, 2012

(54) ELECTRONIC COMPONENT MOUNTING APPARATUS

(75) Inventors: Kazuyoshi Oyama, Ashikaga (JP);
Tsutomu Yanagida, Oizumi (JP);
Yoshinao Usui, Tatebayashi (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 0 days.

(21) Appl. No.: 12/881,719

(22) Filed: Sep. 14, 2010

(65) Prior Publication Data
US 2011/0072654 A1  Mar. 31, 2011

(30) Foreign Application Priority Data
Sep. 29, 2009  (JP) .................................. 2009-224085

(51) Int. Cl.
*B23P 19/00* (2006.01)
(52) U.S. Cl. .................. 29/739; 29/740; 29/741
(58) Field of Classification Search .................. 29/739, 29/740, 741
See application file for complete search history.

(56) References Cited

U.S. PATENT DOCUMENTS

| | | | |
|---|---|---|---|
| 5,692,292 A * | 12/1997 | Asai et al. ........................ | 29/740 |
| 5,706,576 A | 1/1998 | Iwasaki et al. | |
| 6,681,468 B1 * | 1/2004 | Uchiyama et al. ......... | 29/407.01 |
| 6,694,606 B1 * | 2/2004 | Ohashi et al. .................... | 29/740 |
| 7,363,702 B2 * | 4/2008 | Kondo ............................. | 29/650 |

FOREIGN PATENT DOCUMENTS

| | | |
|---|---|---|
| EP | 1 006 770 A1 | 6/2000 |
| JP | 2008-226975 A | 9/2008 |
| WO | 2008041719 * | 4/2008 |

OTHER PUBLICATIONS

English translation of Japanes Pat. No. 2008-091675 A.*
European Search Report dated Dec. 23, 2010 (Four (4) pages).

* cited by examiner

*Primary Examiner* — Carl Arbes
(74) *Attorney, Agent, or Firm* — Crowell & Moring LLP

(57) ABSTRACT

There is a need for providing an electronic component mounting apparatus, a component supply apparatus, and an electronic component mounting method capable of reducing inadvertent insertion of component supply tape and ensuring high reliability or capable of reducing wrong insertion of component supply tape, supplying new electronic component tape, and ensuring a high operation rate. Supply tape is inserted into an insertion entry of a component supply apparatus. An electronic component mounted on the supply tape is absorbed and is mounted on a printed board. Information about the electronic component mounted on the supply tape is read. Based on the read information, the component supply apparatus for inserting the supply tape is selected. The insertion entry is opened while it is closed when no supply tape is mounted.

16 Claims, 8 Drawing Sheets

FIG. 6

| LANE NUMBER | ID INFORMATION |
|---|---|
| 1 | IC 0204 |
| 2 | IC 0306 |
| 3 | RESISTOR 0204 |
| 4 | DIODE 0816 |
| 5 | |

57a — LANE NUMBER
57b — ID INFORMATION

Step 1

Step 2

Step 3

Step 4

Step 1

Step 2

Step 3

Step 4

Step 5

Step 6

ELECTRONIC COMPONENT MOUNTING APPARATUS

BACKGROUND OF THE INVENTION

1. Field of the Invention

The present invention relates to an electronic component mounting apparatus, a component supply apparatus, and an electronic component mounting method. More particularly, the invention relates to an electronic component mounting apparatus, a component supply apparatus, and an electronic component mounting method with high reliability capable of preventing wrong insertion operations of supply tape.

2. Description of Related Art

There is an increasing demand for improving the operation rate of an electronic component mounting apparatus for manufacturing circuit boards by mounting electronic components on printed boards. For this purpose, it is important to not only finish supplying or rearranging electronic components in a short period of time but also correctly and reliably mount a component supply cart with proper electronic components.

JP-A No. 226975/2008 discloses a conventional technology. According to the technology disclosed in JP-A No. 226975/2008, a bar code is provided for a supply reel of component supply tape mounted with electronic components. Another bar code is provided for a component supply apparatus where the supply reel is to be mounted. The both bar codes are read and their data is collated and verified. The supply reel is then mounted on the component supply apparatus. The component supply apparatus is placed on the component supply cart. According to the technology described in JP-A No. 226975/2008, the above-mentioned operation is conducted on the supply cart.

According to the above-mentioned conventional technology, however, an insertion section for the supply tape is always opened. Even after the bar code data is collated, it might be impossible to completely prevent wrong insertion operations of the component supply tape such as mounting the component supply tape on an unintended component supply apparatus or placing the component supply apparatus on an unintended component supply cart.

According to the above-mentioned conventional technology, electronic components need to be preset before they are mounted on a printed board. There may be a case where the supply tape runs out of electronic components while mounted on the printed board and no other alternative component supply apparatus is available. In such a case, a solution might require a complicated operation of connecting a new supply tape to the back end of the supply tape running out of electronic components. If unintended supply tape is connected, the mounting operation must be stopped temporarily.

SUMMARY OF THE INVENTION

An object of the present invention is to provide an electronic component mounting apparatus, a component supply apparatus, and an electronic component mounting method with high reliability capable of reducing wrong insertion operations of supply tape.

Another object of the present invention is to provide an electronic component mounting apparatus, a component supply apparatus, and an electronic component mounting method capable of reducing wrong insertion operations of supply tape and supplying new electronic component tape at a high operation rate.

In order to achieve one of the objects of the invention, a first aspect of the invention is to insert supply tape into an insertion entry of a component supply apparatus, absorb an electronic component mounted on the supply tape, mount the absorbed electronic component on a printed board, read information about the electronic component mounted on the supply tape, select the component supply apparatus for inserting the supply tape based on the read information, and open the insertion entry that is closed when no supply tape is mounted.

In order to achieve one of the objects of the invention, a second aspect of the invention in addition to the first aspect is to notify a component supply apparatus into which supply tape needs to be inserted.

In order to achieve one of the objects of the invention, a third aspect of the invention in addition to the first aspect is to absorb and mount an electronic component at the first preparation stage after the supply tape is inserted into all component supply apparatuses.

In order to achieve one of the objects of the invention, a fourth aspect of the invention in addition to the first aspect is to close the insertion entry of a component supply apparatus running out of electronic components while electronic components are absorbed and mounted.

In order to achieve one of the objects of the invention, a fifth aspect of the invention in addition to the fourth aspect is to apply a method based on the first or second aspect to the relevant component supply apparatus in order to insert new supply tape after the insertion entry is closed.

In order to achieve one of the objects of the invention, a sixth aspect of the invention in addition to the fifth aspect is to absorb and mount an electronic component using an alternative component supply apparatus having the same electronic component as the component supply apparatus running out of an electronic component.

In order to achieve one of the objects of the invention, a seventh aspect of the invention in addition to the fifth aspect is to continuously absorb and mount an electronic component using the alternative component supply apparatus except a process on the component supply apparatus running out of an electronic component.

According to the invention, it is possible to provide an electronic component mounting apparatus, a component supply apparatus, and an electronic component mounting method with high reliability capable of reducing wrong insertion operations of supply tape.

According to the invention, it is possible to provide an electronic component mounting apparatus, a component supply apparatus, and an electronic component mounting method capable of reducing wrong insertion operations of supply tape and supplying new electronic component tape at a high operation rate.

BRIEF DESCRIPTION OF THE DRAWINGS

FIG. 6 shows an example of ID collation data according to an embodiment;

DETAILED DESCRIPTION OF THE PREFERRED EMBODIMENTS

Figure 1:
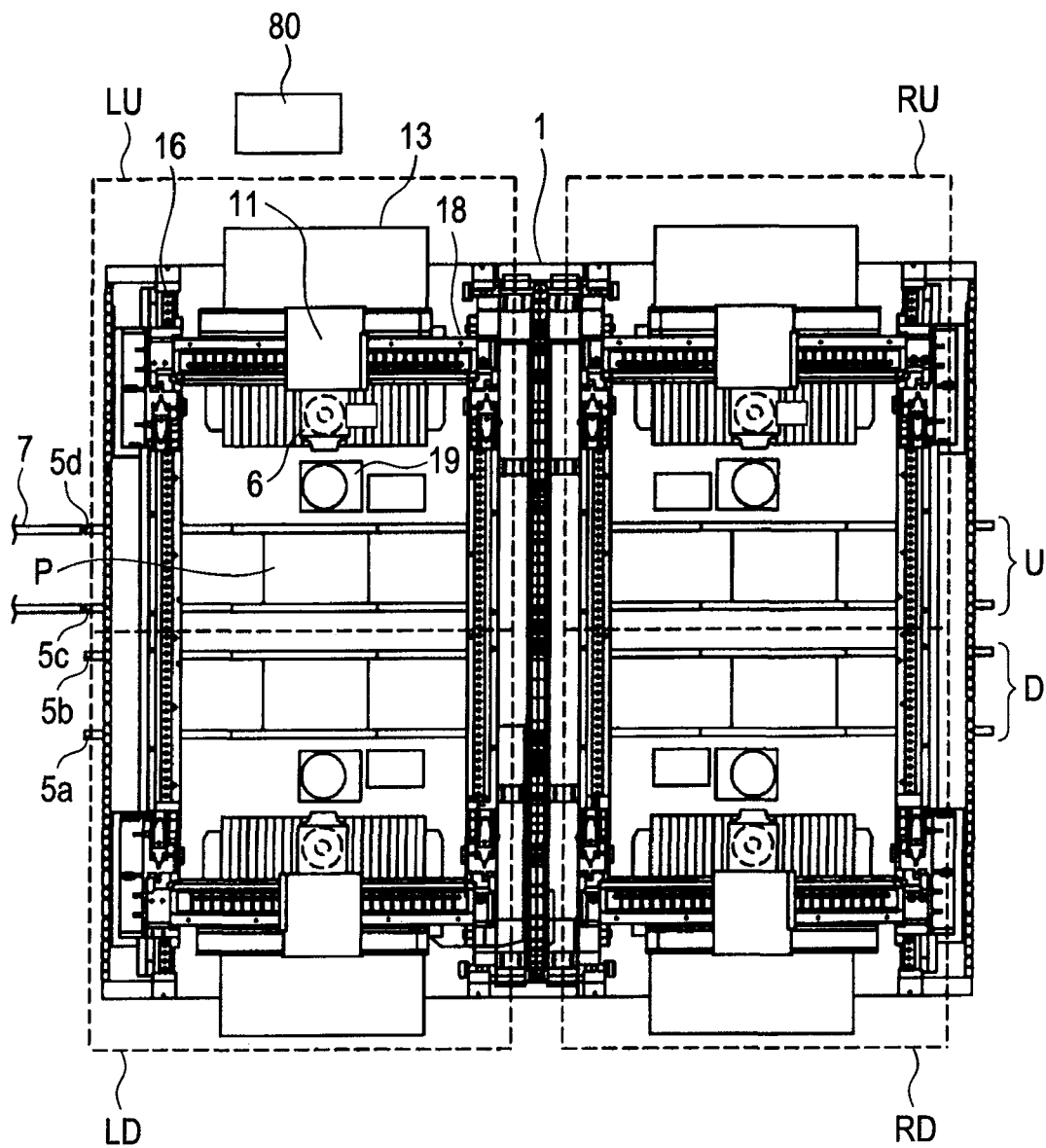
FIG. 1 is a plan view of an electronic component mounting apparatus according to an embodiment of the invention.

Embodiments of the electronic component mounting apparatus will be described in further detail with reference to the accompanying drawings. FIG. 1 is a plan view of an electronic component mounting apparatus 1 according to an embodiment of the invention. The electronic component mounting apparatus 1 (or shortly a main unit 1 as needed) includes four blocks, two upper and lower blocks LU and LD at the left side and two upper and lower blocks RU and RD at the right side, and a controller 80. Basically, reference numerals are provided for the LU block only. Each block is provided with a component supply area 13, a mounting head 6, a mounting head unit 11, and a component monitoring camera 19. The component supply area 13 is provided with many tape feeders. The mounting head unit 11 moves the mounting head 6. The component monitoring camera 19 captures how the mounting head absorbs and holds an electronic component. The mounting head unit 11 horizontally moves along a horizontal rail 18 including a linear motor and vertically moves along a vertical rail 16 including a linear motor.

According to this configuration, the mounting head 6 fixed to the mounting head unit 11 absorbs an electronic component from the component supply area 13. The component monitoring camera 19 monitors how the electronic component is absorbed and held. The mounting head 6 moves to a specified position of a printed board P and mounts the absorbed electronic component on the printed board P.

These operations are performed in the four blocks. There are four chutes 5a through 5d to convey the printed board P at the center of the main unit 1. Two upper chutes 5c and 5d are included in a printed board conveyor line U for the upper blocks. Two lower chutes 5a and 5b are included in the printed board conveyor line D for the lower blocks. A transfer section 7 distributes a printed board P to the printed board conveyor line U or D.

Figure 2:
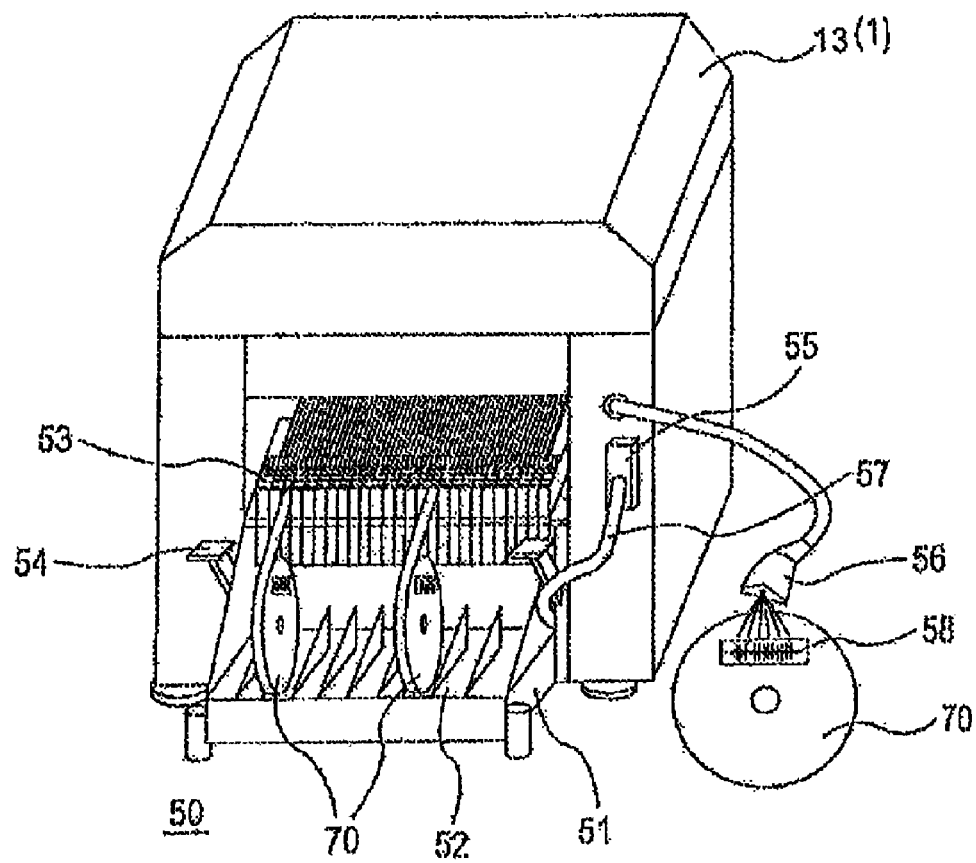
FIG. 2 is a perspective view of a component supply area and a component supply cart according to an embodiment.

FIG. 2 shows an embodiment of a component supply cart 50 attached to the component supply area 13 of the main unit 1 in FIG. 1. The component supply cart 50 includes a base section 51, a reel storage section 52, a component supply apparatus fixing section 53, a handle section 54, and a connector (not shown). The reel storage section 52 stores multiple supply reels 70 for winding supply tape 60 that contains various types of electronic components to be mounted on a printed board. Each supply tape 60 contains a specific type of electronic components. The component supply apparatus fixing section 53 fixes multiple component supply apparatusses 2 that are regularly arranged correspondingly to the multiple supply reels. The handle section 54 attaches and detaches the component supply cart 50 from the component supply area 13. The connector is connected to a signal cable 57 for exchanging signals with the main unit 1. The main unit 1 is provided with a cart connector 55 and a bar code reader 56. The cart connector 55 is connected to the signal cable 56. The bar code reader 56 reads a bar code 58 (to be described later) attached to the supply reel. FIG. 2 shows only two sets of the supply reel 70 and the supply tape 60 for simplicity.

Figure 3:
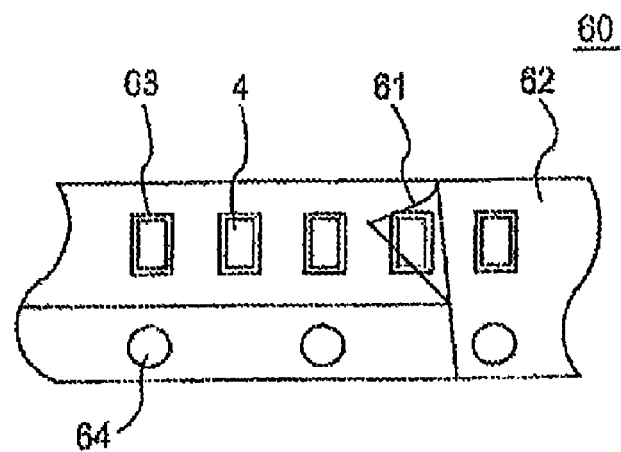
FIG. 3 shows a configuration of supply tape according to an embodiment.

FIG. 3 shows the configuration of the supply tape 60. The supply tape 60 includes carrier tape 62 and cover tape 61. The carrier tape 62 includes a container 63 for an electronic component 4. The cover tape 61 covers the carrier tape. One end of the carrier tape 62 is engaged with a sprocket (to be described later). The carrier tape 62 includes sprocket holes 64 at a specified interval for moving the supply tape.

Figure 4:
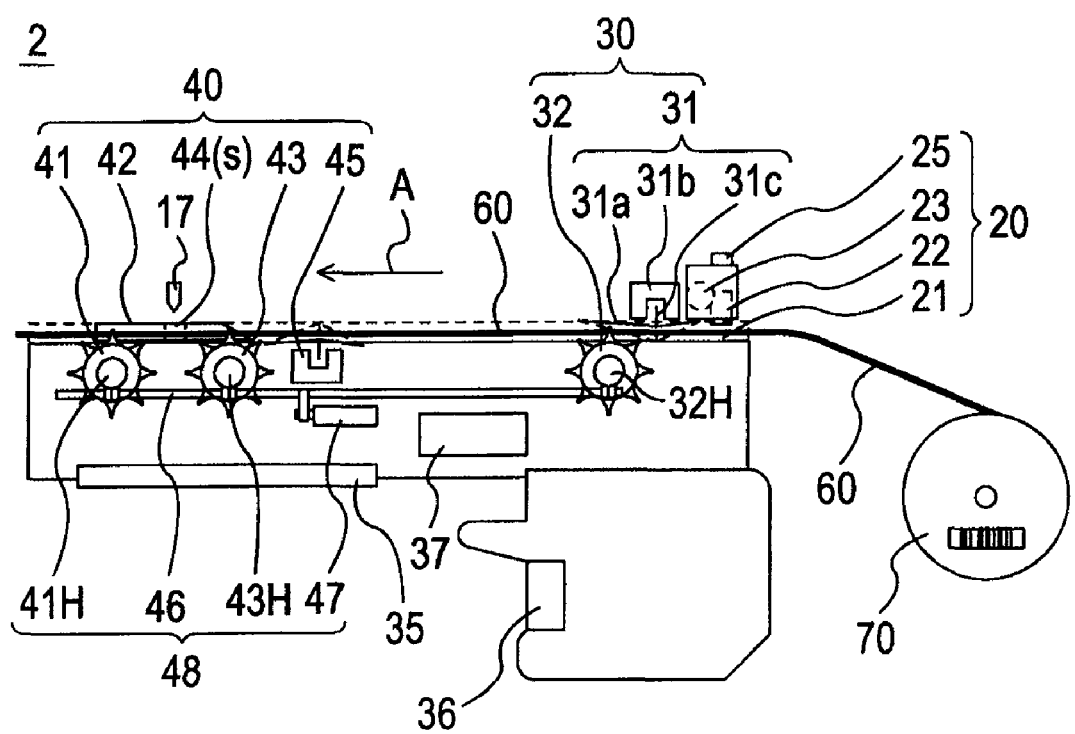
FIG. 4 shows a component supply apparatus according to an embodiment.

FIG. 4 shows an embodiment of the component supply apparatus 2 shown in FIG. 2. Basically, the component supply apparatus 2 includes an insertion gate section 20, a supply tape insertion section 30, an electronic component mounting section 40, a sprocket driving section 48, a cassette fixing section 35, an interface 36, and a supply cassette control section 37. The insertion gate section 20 provides means for preventing the supply tape 60 from being inserted wrong. The supply tape insertion section 30 inserts the supply tape. The electronic component mounting section 40 moves an electronic component to an absorption position S corresponding to an absorption nozzle 17. The sprocket driving section 48 drives three sprockets (to be described later) together included in the supply tape insertion section 30 and the electronic component mounting section 40. The cassette fixing section 35 fixes the component supply apparatus 2 to the component supply cart 50. The interface 36 exchanges signals with the main unit 1 via the signal cable shown in FIG. 2. The supply cassette control section 37 receives information from the main unit or signals from a sensor (to be described later) contained in the component supply apparatus 2, controls the respective sections, and exchanges signals with the main unit 1.

The insertion gate section 20 is provided as an entry open-close section and includes an insertion entry 21, a gate 22, a small motor 23, and an LED 25. The insertion entry 21 allows the supply tape 60 to be inserted. The gate 22 opens and closes the insertion entry. The small motor 23 moves the gate up and down. As will be described, the LED 25 indicates the component supply apparatus into which the component supply tape must be inserted. When a new reel of supply tape 60 needs to be mounted on the component supply apparatus 30, the insertion gate section 20 opens or closes the gate based on an instruction from the main unit 1 so as to prevent the tape from being inserted wrong.

The supply tape insertion section 30 includes a gate section tape detection sensor 31 and an insertion sprocket 32. The gate section tape detection sensor 31 detects the presence or absence of the supply tape 60 at the insertion gate section 20. The insertion sprocket 32 feeds the supply tape 60 toward the absorption position S. The gate section tape detection sensor 31 includes a V-shaped leaf spring 31a and an optical sensor 31b. An optical path interrupting plate 31c is provided at the center of the leaf spring 31a. The presence of the supply tape 60 is detected when the optical path interrupting plate 31c interrupts an optical path of the optical sensor. As a result, the gate section tape detection sensor 31 provides two functions. One is to detect the supply tape 60 inserted from the insertion gate section 20. The other is to detect the end of the supply tape 60 when its back end passes through the gate section tape detection sensor 31. The sprocket driving section 48 drives the sprocket 32. The sprocket 32 engages with the sprocket hole 64 (see FIG. 3) in the supply tape 60 to move the supply tape in the direction of arrow A.

The electronic component mounting section 40 includes a driving sprocket 41, a pressing mechanism 42, a pushing sprocket 43, an absorption hole 44, and a driving section tape detection sensor 45. The driving sprocket 41 mainly drives the supply tape 60. The pressing mechanism 42 presses the supply tape 60 against the driving sprocket 41 so that the driving sprocket can reliably engage with the sprocket hole 64 (see FIG. 3). The pushing sprocket 43 pushes the tip of the supply tape 60, when inserted, into the pressing mechanism 42. The absorption hole 44 is provided between the driving sprocket 41 and the pushing sprocket 43 and is used for the absorption nozzle 17 to absorb an electronic component. The driving section tape detection sensor 45 is provided just before the pushing sprocket 43 and detects the presence or absence of the supply tape. The pressing mechanism 42 has another mechanism (not shown) for cutting or peeling off the cover tape 61 shown in FIG. 3 in order to take the electronic component 4 out of the supply tape. The driving section tape detection sensor 45 has basically the same configuration as that of the gate section tape detection sensor 31.

Three sprockets (the insertion sprocket 32, the driving sprocket 41, and the pushing sprocket 43) are concentrically provided with worm wheels 32H, 41H, and 43H, respectively. A worm gear 46 engages with these worm wheels. The sprocket driving section 48 includes a sprocket driving motor 47 that simultaneously drives the three sprockets through the worm gear 46. This configuration simplifies the sprocket driving mechanism and provides easy control without the need to synchronize timings for driving the three sprockets.

The following describes how these mechanisms are used to insert the supply tape into the component supply apparatus 2 by preventing wrong insertion of the supply tape while the component supply cart 50 is attached to the main unit 1 or the supply tape 60 is prepared or replaced.

Figure 5A:
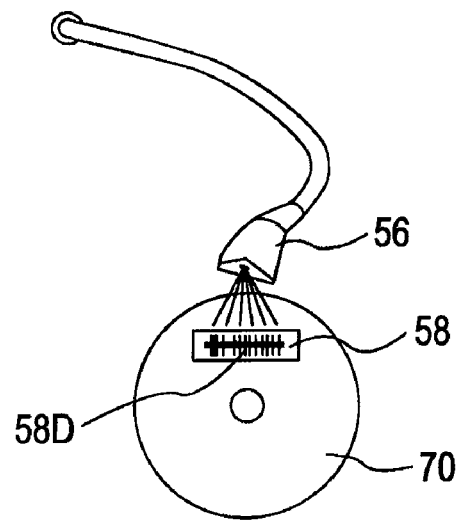
FIGS. 5A, 5B, and 5C illustrate a basic concept of preventing wrong insertion of tape according to an embodiment.
Figure 5B:
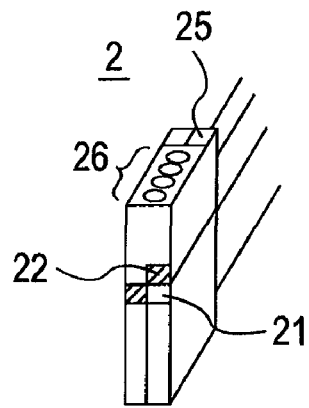

FIGS. 5A, 5B, and 50 illustrate basic concept of preventing wrong insertion of the supply tape according to the embodiment. As shown in FIG. 5A, the supply reel 70 is provided with ID data that indicates types, sizes, and the other information about electronic components mounted on the supply tape. The ID data is read and its result is transmitted to the controller 80 (see FIG. 1) of the main unit 1 or a higher-level line controller (not shown). According to the embodiment, the bar code 58 is used as a medium for ID data 58D. The bar code reader 56 reads the bar code 58. Other media include a p-chip, for example.

The controller previously stores ID collation data 57 to be collated with that ID data, for example. FIG. 6 shows an example of the ID collation data. The ID collation data contains a lane number 57a and ID information 57b. The lane number 57a is associated with a specific component supply apparatus. The ID information 57b corresponds to the lane number and indicates types or sizes of electronic components that must be included in the component supply apparatus 2. The controller 80 collates the ID data 58D with the ID collation data 57 to determine a targeted lane and transfers the determination result to the component supply apparatus 2 corresponding to the lane.

When the targeted component supply apparatus is not found from the collation, an operator is notified of it. The notification might be provided by generating a sound or blinking an LED provided for the bar code reader.

Figure 5C:
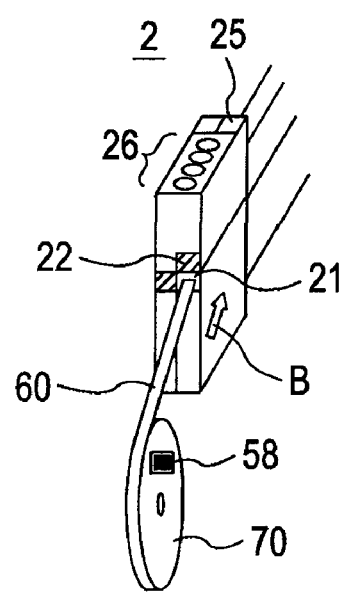

The supply cassette control section 37 (see FIG. 4) of the corresponding component supply apparatus 2 receives the determination result. As shown in FIG. 5B, the supply cassette control section 37 opens the gate 22 of the insertion entry 21, blinks the LED 25 at the top, and notifies an operator of the component supply apparatus into which the supply tape should be inserted. As shown in FIG. 5C, the operator inserts the supply tape 60 into the insertion entry 21 in the direction of arrow B. The supply cassette control section 37 uses the gate section tape detection sensor 31 shown in FIG. 4 to detect the insertion of the supply tape and drives the insertion sprocket 32 to feed the supply tape 60 toward the absorption position S. Techniques of notification to the operator include not only the LED but also a display unit such as an LCD monitor, a flag, or any other means that the operator can easily recognize.

For some reason, the operator might not be able to complete the sequence of operations within a specified time. In such a case, the supply cassette control section 37 closes the gate 22 and forces the operator to do the same procedure for minimizing a possibility to wrong insert the tape.

In order to minimize wrong insertion of the tape, it might be preferable to provide the component supply apparatus with an indication for confirming the procedure or a procedure confirmation switch 26 for advancing the procedure.

The above-mentioned embodiment can minimize a possibility to wrong insert the tape and can provide the electronic component mounting apparatus, the component supply apparatus, or the electronic component mounting method with high reliability.

Figure 7:
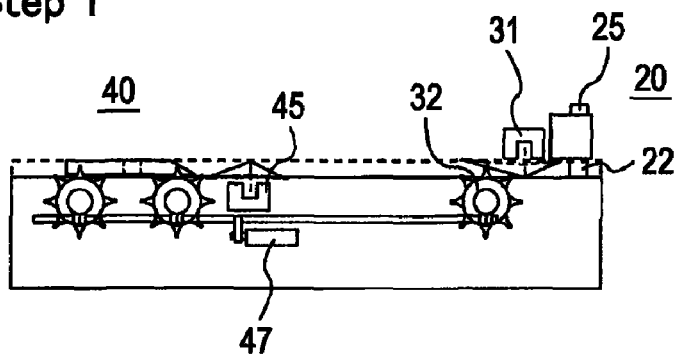
FIG. 7 shows operations of the component supply apparatus according to an embodiment when the apparatus, initially not mounted with supply tape, is mounted with supply tape.
Figure 7:
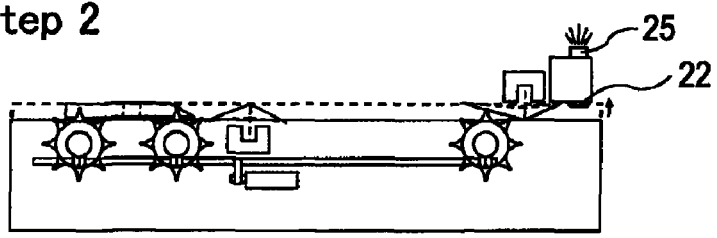
Figure 7:
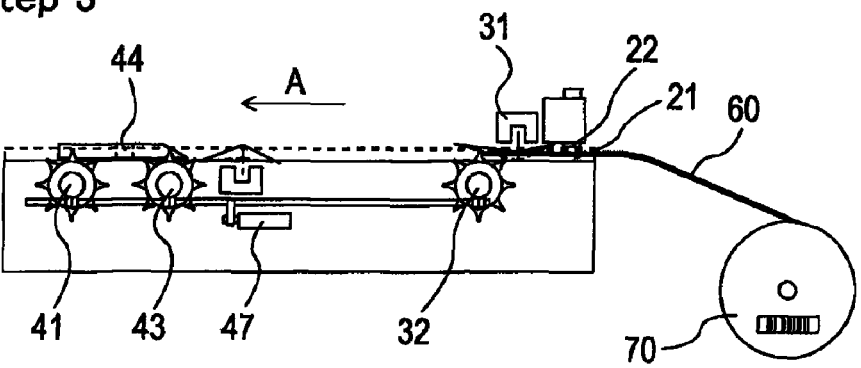
Figure 7:
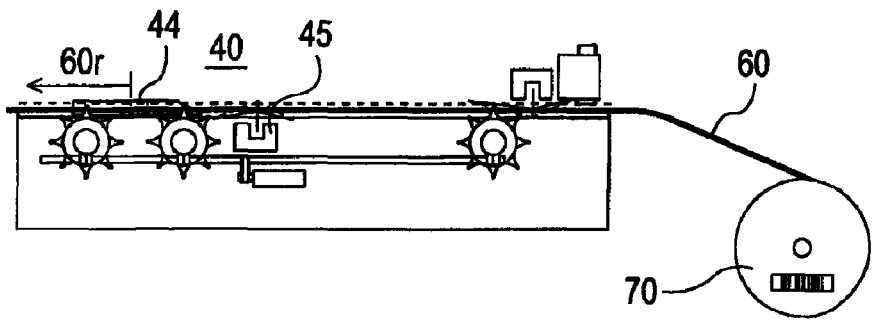

With reference to FIG. 7, the following describes operations of the component supply apparatus 2 when the apparatus, initially not mounted with supply tape, is mounted with supply tape 60.

Step 1 shows that the component supply tape is not mounted. As described with reference to FIGS. 5A, 5B, and 50, the gate 22 opens at the component supply apparatus that is determined to insert the supply tape 60. The LED 25 blinks as notification to the operator (Step 2). The operator recognizes the component supply apparatus for inserting the supply tape 60 and inserts the supply tape 60 into the insertion entry 21. The gate section tape detection sensor 31 detects the insertion. The sprocket driving motor 47 drives the insertion sprocket 32 to fast-forward the supply tape in the direction of arrow A. At this time, the driving sprocket 41 and the pushing sprocket 43 are also driven simultaneously (Step 3). The driving section tape detection sensor 45 then detects that the supply tape 60 reaches the electronic component mounting section 40. The tip of the supply tape 60 is provided with an unmounted area 60r where no electronic component is mounted. The supply tape is advanced as long as the unmounted area 60r and is temporarily stopped for initial positioning so that the back end of the unmounted area reaches the absorption hole 44 (Step 4). The main unit starts the mounting operation when the preparation is completed on all the component supply apparatuses where the supply tape is to be mounted.

According to the embodiment shown in FIG. 7, the gate opens only at the component supply apparatus where the supply tape should be inserted. When the supply tape is not inserted for a specified time period, the gate is closed to minimize a possibility of wrong inserting the supply tape. It is possible to provide a highly reliable component supply method and an electronic component mounting method based on it.

According to the embodiment shown in FIG. 7, the supply tape can be mounted while the component supply cart is attached to the main unit 1. Ad hoc preparations are available. It is possible to provide an electronic component mounting apparatus, a component supply apparatus, and an electronic component mounting method at a high operation rate.

Figure 8A:
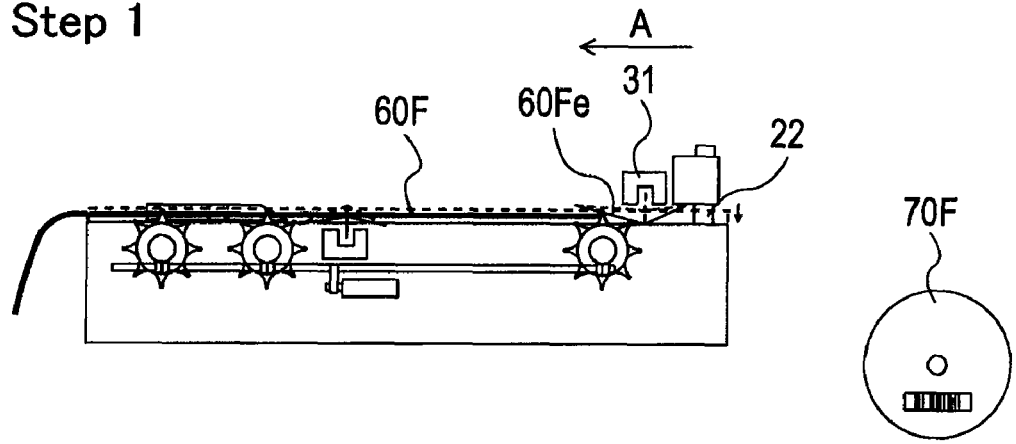
FIG. 8A shows initial operations of the component supply apparatus according to an embodiment when the supply tape runs out of electronic components in the course of a normal mounting process and new supply tape is to be inserted.
Figure 8A:
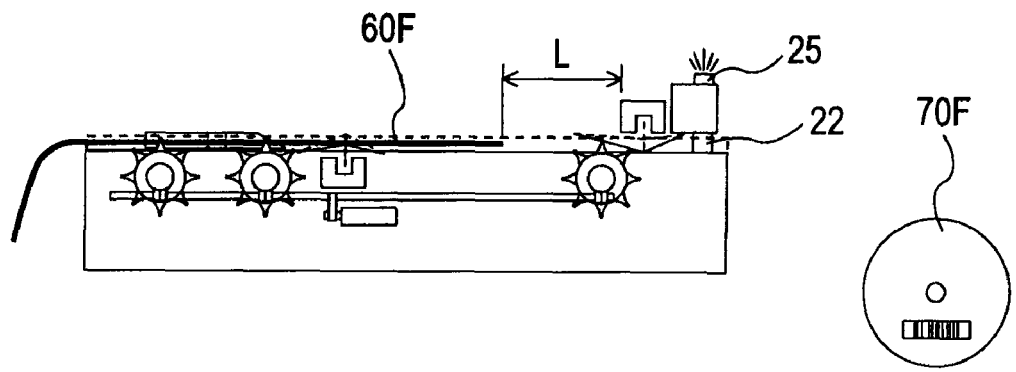
Figure 8A:
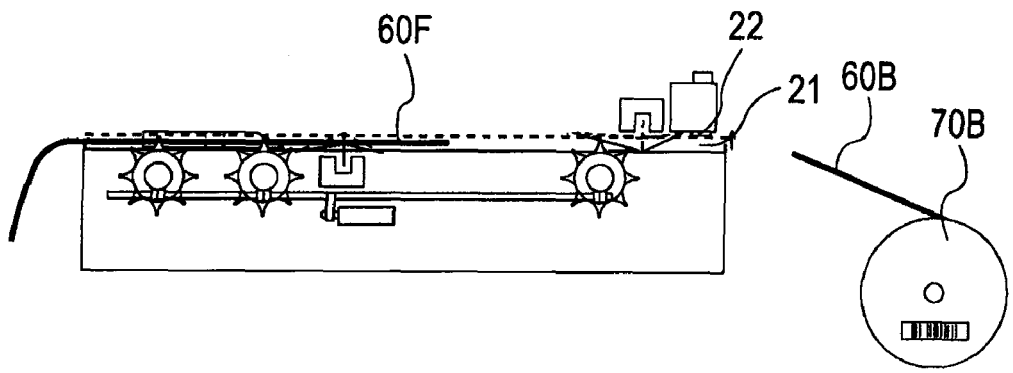
Figure 8B:
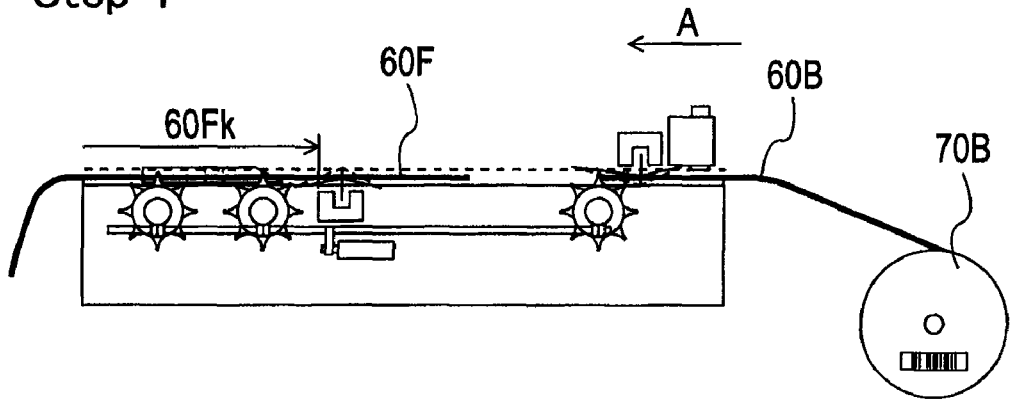
FIG. 8B shows operations of the component supply apparatus subsequent to those in FIG. 8A when the supply tape runs out of electronic components and the new supply tape is inserted.
Figure 8B:
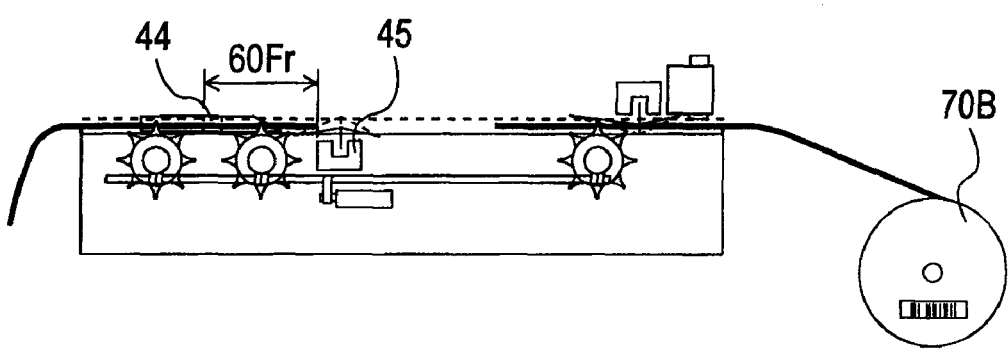
Figure 8B:
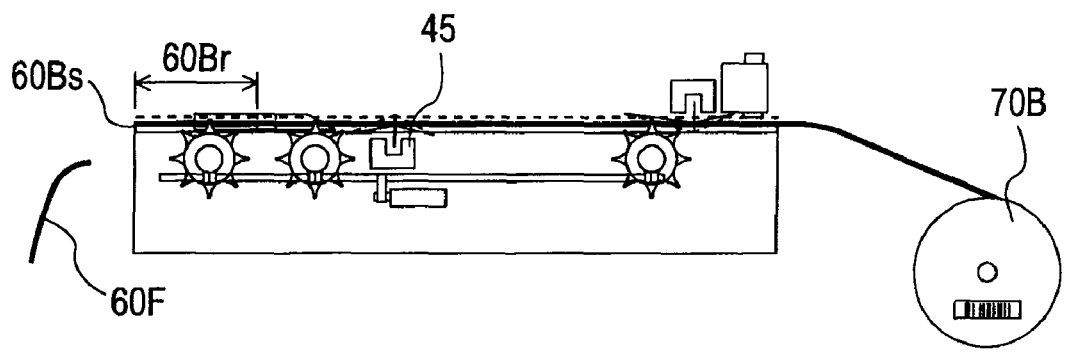

With reference to FIGS. 8A and 8B, the following describes initial operations of the component supply apparatus when the supply tape of electronic components is exhausted in the course of a normal mounting process and new supply tape is to be inserted. An arrow A in FIGS. 8A and 8B indicates the direction of advancing the supply tape.

While the mounting process progresses orderly, the gate section tape detection sensor 31 detects an end 60e of the supply tape 60 and once closes the gate 22 (Step 1). Step 1 represents the supply reel 60 as a preceding supply tape 60F and the corresponding supply reel as a preceding supply reel 70F. The specified number of sprocket holes 64 is advanced in order to maintain a specified distance L to a newly inserted succeeding supply tape 60B. The main unit 1 generates notification that the supply tape is going to run out of components. An operator near the insertion gate section 20 is given the notification through the blinking LED 25 at the top of the gate 22. An operator near the main unit 1 is given the notification that is transmitted to the controller of the main unit 1 and is displayed on a monitor, for example. An operator in an operator room (not shown) is given the notification displayed on a monitor for a higher-level controller. The notification might be generated at Step 1 (Step 2).

The operator receives the notification and performs the collation described in FIGS. 5A, 5B, and 5C on a succeeding supply reel 70B. When the collation is successful, the insertion entry 21 of component supply apparatus opens. The operator inserts the succeeding supply tape into the entry (Step 3). The preceding supply tape 60F still contains an area 60Fk where electronic components to be mounted remain. The tape is not fast-forwarded unlike Step 3 in FIG. 7. The succeeding supply tape 60b is fed in synchronization with the absorption of electronic components from the absorption hole 44 (Step 4).

The driving section tape detection sensor 45 detects an end 60Fe of the preceding supply tape 60F and determines that the unmounted area (no electronic component contained) of the preceding supply tape reaches the absorption hole 44. The component supply apparatus starts the fast-forward (Step 5). The driving section tape detection sensor 45 then detects that a tip 60Bs of the succeeding supply tape 60B reaches the electronic component mounting section 40. The beginning of the succeeding supply tape 60B contains an unmounted area 60Br where no electronic component is mounted. The supply tape is advanced as long as the unmounted area 60Br and is temporarily stopped for initial positioning (Step 6). The mounting operation is continued in accordance with the overall process.

Similarly to FIG. 7, the embodiment shown in FIGS. 8A and 8B can minimize a possibility of wrong inserting the supply tape and provide the electronic component mounting apparatus, the component supply apparatus, or the electronic component mounting method with high reliability.

The embodiment shown in FIGS. 8A and 8B can provide the electronic component mounting apparatus, the component supply apparatus, and the electronic component mounting method at a high operation rate so as to be able to minimize a possibility of wrong insertion of the component supply tape and fast supply a new reel of succeeding supply tape containing electronic components even though the supply tape runs out of electronic components during mounting of electronic components.

Finally, even though the operator is notified that the preceding supply tape runs out of electronic components, he or she might not be able to mount the succeeding supply tape for some reason as shown at Step 3 in FIG. 8A. The component supply apparatus assumes this situation to be electronic component unavailability (successive absorption error). The gate section tape detection sensor 31 and the driving section tape detection sensor 45 check for a successive absorption error both without using any supply tape while electronic components are mounted in process.

In this case, the following action is taken. Firstly, the gate 22 is closed. The LED 25 for the relevant component supply apparatus continues to blink. An operator near the main unit 1 is given the notification that is transmitted to the controller of the main unit 1 and is displayed on a monitor, for example. An operator in an operator room (not shown) is given the notification displayed on a monitor for a higher-level controller. Secondly, as shown at Step 5 in FIG. 8B, the component supply apparatus fast-forwards the supply tape for a specified amount of the unmounted area on the supply tape that runs out of electronic components. For example, the specified amount is controlled to be equivalent to a time period required to disengage the end of the supply tape running out of electronic components from the driving sprocket 41.

Any one of the following actions is taken until the operator mounts the succeeding supply tape. The first action is to use electronic components for the component supply apparatus that is provided for a spare lane including the same electronic components or is already used for the mounting process. The second action is to mount the electronic component without the mounting process and then proceed to a recovery process. Steps 3 and 4 in FIG. 7 are conducted when the succeeding supply tape is mounted. The succeeding supply tape is advanced for initial positioning and this information is given to the higher-level controller. The mounting operation is then continued in accordance with the overall process.

Similarly to the other embodiments, the last embodiment can minimize a possibility to wrong insert the supply tape and provide the electronic component mounting apparatus, the component supply apparatus, or the electronic component mounting method with high reliability.

Compared to the embodiment of immediately mounting the succeeding supply tape, the last embodiment temporarily runs out of electronic components and degrades the productivity, but is capable of immediately supplying electronic components after the succeeding supply tape is mounted. It is possible to provide the electronic component mounting apparatus, the component supply apparatus, or the electronic component mounting method with higher productivity than that of conventional technologies.

While there have been described specific preferred embodiments of the present invention, additional alternatives, modifications, and variations will readily occur to those skilled in the art based on the above-mentioned description. Therefore, the invention in its broader aspects includes the alternatives, modifications, and variations without departing from the spirit or scope of the general inventive concept.

What is claimed is:

1. An electronic component mounting apparatus comprising:
   a component supply apparatus including a sprocket driving section that drives a sprocket rotating in engagement with a sprocket hole in supply tape having an electronic component and moves the supply tape to an absorption position for absorbing the electronic component from outside of the component supply apparatus;
   a component supply cart having a plurality of lanes capable of mounting the component supply apparatus;
   a mounting head for absorbing and mounting the electronic component from the component supply apparatus;
   a controller for controlling the component supply apparatus; and
   wrong insertion prevention means for the supply tape having:
      an entry open-close section of the component supply apparatus that opens and closes an insertion entry of the component supply apparatus for inserting the supply tape;

ID data input means for inputting ID data containing information about the electronic component provided on the supply tape; and a control section for selecting a lane associated with a component supply apparatus based on the ID data and providing control to open the entry open-close section of the component supply apparatus on the selected lane.

2. The electronic component mounting apparatus according to claim 1, wherein the control section selects the lane based on ID collation data containing relation between the ID data and the lane and outputs a selection instruction to the component supply apparatus on the selected lane; and wherein the control section is provided for the component supply apparatus.

3. The electronic component mounting apparatus according to claim 2, wherein the component supply apparatus includes an insertion detection means for detecting insertion of the supply tape and an insertion section sprocket driving section for driving an insertion section sprocket that moves the inserted supply tape toward the absorption position in engagement with the sprocket hole; and wherein the control section controls the insertion section sprocket driving section based on a detection result from the insertion detection means.

4. The electronic component mounting apparatus according to claim 1, wherein the ID data is provided for a reel to wind the supply tape; and wherein the ID data input means is directly or indirectly connected to the controller and includes reading means for reading the ID data.

5. The electronic component mounting apparatus according to claim 4, wherein the ID data is equivalent to a bar code and the reading means is equivalent to a bar code reader.

6. The electronic component mounting apparatus according to claim 4, wherein the ID data is equivalent to a p-chip and the reading means is equivalent top-chip reading means.

7. The electronic component mounting apparatus according to claim 1, wherein the wrong insertion prevention means includes means for notifying the component supply apparatus on the selected lane.

8. The electronic component mounting apparatus according to claim 1, wherein the control section is provided for the controller.

9. The electronic component mounting apparatus according to claim 3, wherein the control section closes the entry open-close section when the detection means detects a back end of the supply tape.

10. The electronic component mounting apparatus according to claim 1, wherein the ID data contains at least one of a type and a shape of the electronic component.

11. The electronic component mounting apparatus according to claim 3, wherein an identical driving source drives the sprocket driving section and the insertion section sprocket driving section.

12. A component supply apparatus comprising:

a sprocket driving section that drives a sprocket rotating in engagement with a sprocket hole in supply tape having an electronic component and moves the supply tape to an absorption position for absorbing the electronic component from outside of the component supply apparatus;

an entry open-close section that opens and closes an insertion entry of the component supply apparatus for inserting the supply tape; and a control section for controlling the entry open-close section based on an instruction from outside of the component supply apparatus, wherein the instruction includes ID data containing information about the electronic component provided on the supply tape.

13. The component supply apparatus according to claim 12, comprising:

insertion detection means for detecting insertion of the supply tape; and an insertion section sprocket driving section for driving an insertion section sprocket that moves the inserted supply tape toward the absorption position in engagement with the sprocket hole, wherein the control section controls the insertion section sprocket driving section based on a detection result from the insertion detection means.

14. The component supply apparatus according to claim 12, comprising:

a notification section for indicating that the supply tape can be inserted into the insertion entry.

15. The component supply apparatus according to claim 13, wherein an identical driving source drives the sprocket driving section and the insertion section sprocket driving section.

16. The component supply apparatus according to claim 13, wherein the control section closes the entry open-close section when the detection means detects a back end of the supply tape.

* * * * *